United States Patent
Caggiano et al.

(10) Patent No.: US 6,243,655 B1
(45) Date of Patent: Jun. 5, 2001

(54) CIRCUIT TRACE PROBE AND METHOD

(75) Inventors: Raymond J. Caggiano, Charlotte, NC (US); Charles Colpo, Tucson, AZ (US); Jeffrey A. Hatley, Mebane, NC (US); W. Peter Soroka, Pleasant Valley, NY (US); Rondell K. Watts, Concord, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/129,378

(22) Filed: Aug. 5, 1998

(51) Int. Cl.$^7$ .................................................. G01R 31/02
(52) U.S. Cl. ........................................... 702/117; 324/761
(58) Field of Search .................................... 324/527, 754, 324/765, 757, 761, 500, 537, 538, 771, 726, 727, 74; 438/496; 702/117

(56) References Cited

U.S. PATENT DOCUMENTS

| | | | |
|---|---|---|---|
| 4,328,264 | * 5/1982 | Johns et al. | 427/97 |
| 4,706,167 | * 11/1987 | Sullivan | 361/406 |
| 5,045,780 | * 9/1991 | Swart | 324/158 |
| 5,137,461 | * 8/1992 | Bindra et al. | 439/74 |
| 5,189,363 | * 2/1993 | Bregman et al. | 324/158 |
| 5,471,151 | * 11/1995 | Difrancesco | 324/757 |
| 5,528,159 | * 6/1996 | Charlton et al. | 324/758 |
| 5,634,265 | * 6/1997 | Difrancesco | 28/825 |
| 5,642,055 | * 6/1997 | Difrancesco | 324/757 |

OTHER PUBLICATIONS

"Essential testability guidelines for current technology," Phillips, J.C., European Test Conference, 1993. Proceedings of ETC 93., Third , 1993, pp. 273–282.*

"Design for testability of printed circuit board assemblies," Lawlor–Wright, T., Intelligent Design Systems (Digest No. 1997/016), IEE Colloquium on , 1997, pp. 1/1–1/4.*

\* cited by examiner

Primary Examiner—Kamini Shah
Assistant Examiner—Edward Raymond
(74) Attorney, Agent, or Firm—Schmeiser, Olsen & Watts; Lawrence R. Fraley

(57) ABSTRACT

According to the preferred embodiments of the present invention, a method of creating and accessing additional test points after circuit board design has been completed is disclosed. The apparatus and methods of the present invention provide test engineers with the ability to leave any circuit interconnections located on the exterior surfaces of a PCB exposed. These exposed circuit interconnections may be identified as access or test points and the apparatus of the present invention is specifically adapted to access, probe, and evaluate these access or test points. To allow the exposed circuit interconnections to be tested without damaging them, the invention includes a new type of probe for use in contacting the exposed traces. The preferred embodiments of the test probe apparatus of the present invention has a relatively flat head to reduce pressure on the circuit interconnections and is coated with dendrites to enhance electrical connectivity between the circuit interconnections and the probe. By using both the apparatus and the methods of the present invention, additional test points may be created on the surface of a PCB after circuit and board design has been completed.

13 Claims, 3 Drawing Sheets

CIRCUIT TRACE PROBE AND METHOD

BACKGROUND OF THE INVENTION

1. Technical Field

This invention relates generally to fabricating electrical components and more specifically relates to the testing of circuits on a printed circuit board.

2. Background Art

Electronic devices have become a vital part of everyday life in this country and throughout the world. Most electronic devices contain large numbers of digital electronic components and analog circuit components that work together to perform various logical operations. The various individual components in many electronic devices are typically linked into circuits on layered printed circuit boards (PCBs). These commonplace electrical circuits control everything from computers to cars to garage door openers to satellites. As new devices are developed, the capabilities of the resulting electronic circuits and components provide increased functionality, usually at a lower cost.

As with any industry, electronic and electrical products are tested prior to introduction into the marketplace. Typically, most electronic and electrical products are tested at least twice, once during the product design phase (for feasibility) and again during the production phase (for quality control). Obviously, the testing and validation process used to test the electrical circuits and the printed circuit boards is not error-free. Ideally, once a product has been tested for feasibility and is being produced, product testing of the electrical circuits and the PCBs should be very straightforward. Unfortunately, while the theory of product testing is sound, the actual testing of circuit and PCBs is often subject to real world constraints that may hinder accurate and complete testing results.

For instance, the gap between the ideal of complete testing and the reality of partial testing of a circuit or PCB is due, in part, to the fact that the primary goal of circuit and board design is functionality. While it may be desirable to add multiple test points on a PCB to facilitate production testing, it will not always be possible to do so. The inclusion of a traditional test point requires that the PCB contain an electrical contact point on the board that may be accessed by an external test apparatus. Each electrical contact point occupies precious space and may impede board functionality. Thus, testability may be lost in a tradeoff with functionality.

In addition, the product design engineers responsible for designing the circuits and PCBs are typically not the individuals responsible for testing the circuits and PCBs. The design engineers may not place a high emphasis on production testability and, therefore, may not incorporate sufficient test points. The addition of new test points after initial design has been completed may require the design engineers to repeat considerable work, thereby increasing costs and delaying product introduction.

Also, once a circuit or PCB design has been approved by management, design changes to include additional desirable test points may, as a practical matter, no longer be feasible. Finally, once a PCB has been assembled, it is typically coated with a sealant known as "procoat" which covers almost the entire surface of the PCB, leaving only the pre-designated testing contact points exposed. The procoat is designed to protect the PCB and to keep dust and other contaminants from interfering with the functional operations of the PCB. In most typical applications, procoat also electrically isolates any surface traces from exterior surfaces.

These practical realities are somewhat disconcerting to a production test engineer who is given the responsibility to ensure quality control for shipping products. The goal of the test engineer is to test the functionality of every major circuit or component on a given PCB. In order to achieve this goal, the production test engineer may desire to create additional test points on a manufactured PCB to allow for more thorough testing of the various circuits and components on the PCB. However, due to the practical constraints explained above, this is typically very difficult to accomplish, if not impossible.

Therefore, there is a need for improved methods which will allow for increased testability of PCBs at the manufacturing stage without impairing board function or excessively increasing the cost or complexity of the manufacturing process. Without new methods or techniques to allow additional test points to be created on a given PCB, the electronics industry will continue to be limited in the ability to improve the reliability of newly designed and manufactured products.

DISCLOSURE OF THE INVENTION

According to the preferred embodiments of the present invention, a method of creating and accessing additional test points after circuit board design has been completed is disclosed. The apparatus and methods of the present invention provide test engineers with the ability to leave any circuit interconnections located on the exterior surfaces of a PCB exposed. These exposed circuit interconnections may be identified as access or test points and the apparatus of the present invention is specifically adapted to access, probe, and evaluate these access or test points. To allow the exposed circuit interconnections to be tested without damaging them, the invention includes a new type of probe for use in contacting the exposed traces. The preferred embodiments of the test probe apparatus of the present invention has a relatively flat head to reduce pressure on the circuit interconnections and is coated with dendrites to enhance electrical connectivity between the circuit interconnections and the probe. By using both the apparatus and the methods of the present invention, additional test points may be created on the surface of a PCB after circuit and board design has been completed.

The foregoing and other advantages and features of the invention will be apparent from the following particular description of a preferred embodiment of the invention as illustrated in the accompanying drawings.

BEST MODE FOR CARRYING OUT THE INVENTION

Figure 1:
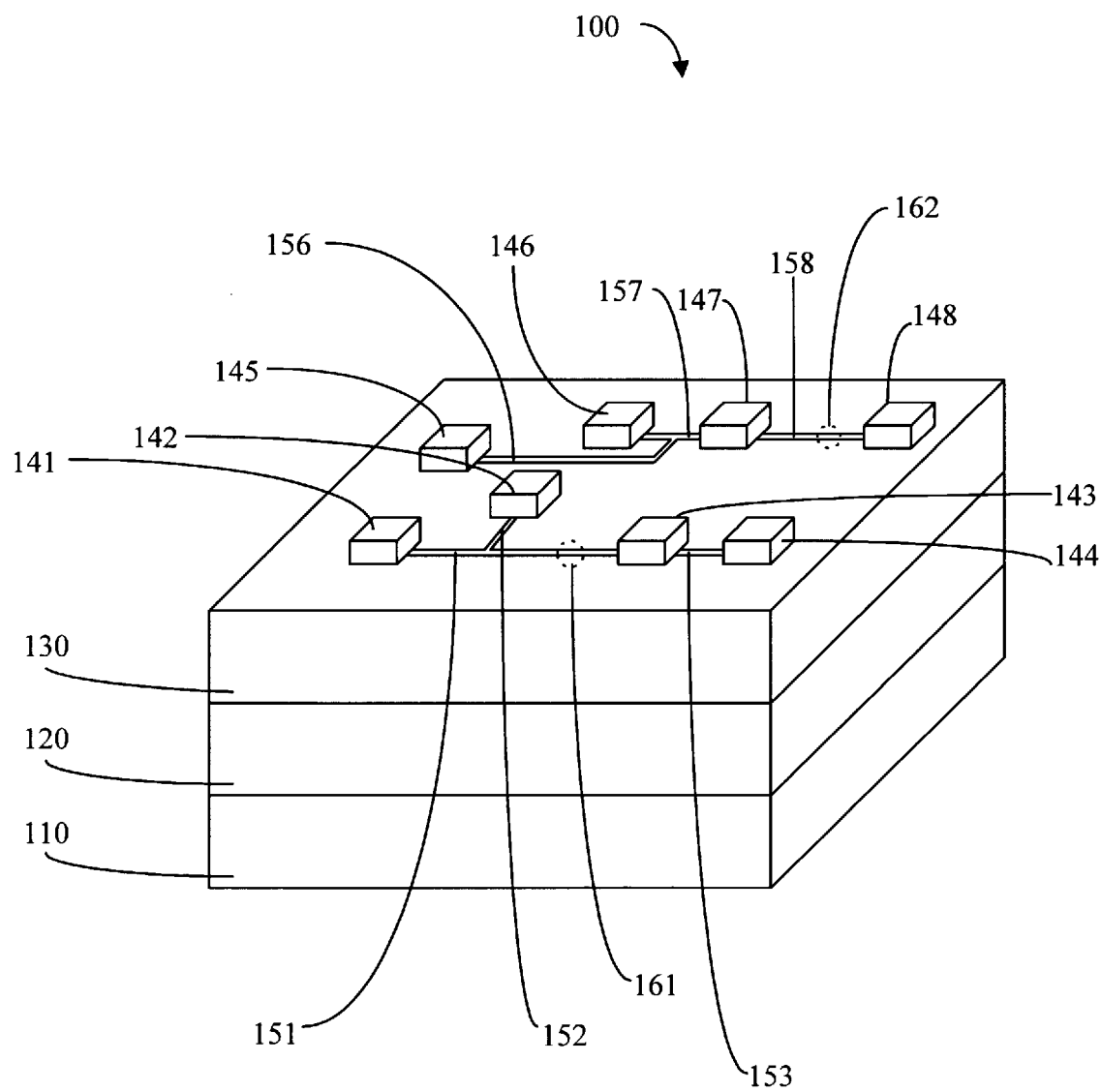
FIG. 1 is a perspective view of a multi-layered circuit board.

According to the preferred embodiments of the present invention, a novel method of creating and accessing additional test points after circuit board design has been completed is disclosed. The apparatus and methods of the present invention provide test engineers with the ability to expose any circuit interconnections located on the exterior surfaces of a PCB. These exposed circuit interconnections may be identified as test points and the apparatus of the present invention is specifically adapted to access, probe, and evaluate these test points. The overview section below presents many basic concepts that will help to understand the invention. Those who are thoroughly versed in PCB design and testing may wish to proceed directly to the detailed description section.

1. Overview

To best understand the present invention, certain principles of chip and board design need to be appreciated. A microchip is constructed primarily of a semi-conducting material, typically silicon. Various electronic devices, such as transistors, capacitors, resistors, etc. are fabricated on a chip. These devices are electrically connected by conducting paths routed within the chip. The configuration and interconnections between the various devices allows the chip to perform logical functions based upon the input it receives. If the circuits on a chip contain a flaw, an incorrect logic function may result.

Digital electronics and other devices, including analog devices, are mounted on printed circuit boards which are designed to be placed inside an electrical or electronic device or product. Similar to the interconnections between devices located within a chip, the various components mounted on a printed circuit board are connected by electrical pathways, typically metal interconnections known as "traces." The design and the configuration of the interconnections between the components on the printed circuit board determines the board's function. As within the individual components, if the traces between the components are flawed, an incorrect logic function for the PCB as a whole may result.

Most printed circuit boards typically contain multiple inter-connected layers. Thus, an entire circuit or "net" may be located entirely on the interior layers of a board. As a practical matter, the nets of the board almost always extend to an exterior layer. The exterior layers of a board are covered by a non-conducting protective coating referred to as a "procoat."

In addition to the inputs and outputs required for board function, a typical PCB also includes a pre-determined number of test points to allow the functionality of the PCB to be verified during production. These test points are used in in-circuit testing and can be critical for quality control of the final product. In-circuit testing consists of using an electrical signal to determine whether a circuit on the board is open or closed, and to determine if analog and digital parameters are within specified limits. In this way, defects in board fabrication may be identified. A test point consists of a contact point on the exterior of the board that is electrically connected to the portion of the circuit to be tested.

Another type of testing is "function testing." In function testing, the printed circuit board is connected to a power supply and powered up to test the operability of the printed circuit board and to verify that it functions properly. If the board fails to function properly, the reason for the failure may very difficult to find due to the inherently limited diagnostic capability of a functional test. In addition, given the practical testing limitations outlined above, ascertaining the reason for board failure may be impossible, and is almost always time consuming and expensive. The most economical way to identify errors in circuit boards is through in-circuit testing of the individual components and nets on the printed circuit board. However, as explained above, in-circuit testing requires sufficient test points to perform thorough testing and is subject to various real-life constraints that may or may not facilitate effective testing of the printed circuit board's functionality.

2. Detailed Description

Creating Test Points

The present invention overcomes the obstacle of having too few traditional test points on a designed board by establishing openings or access points in the procoat to allow circuit traces or points on the circuit traces to be used as new, additional test points for testing PCBs. In addition, the present invention teaches the use of a specially designed test probe to contact the new test points. The invention may be used after the functional design of a circuit board has been completed but before large scale fabrication has begun and may also be used for reliability testing and/or troubleshooting of finished printed circuit boards.

Figure 2:
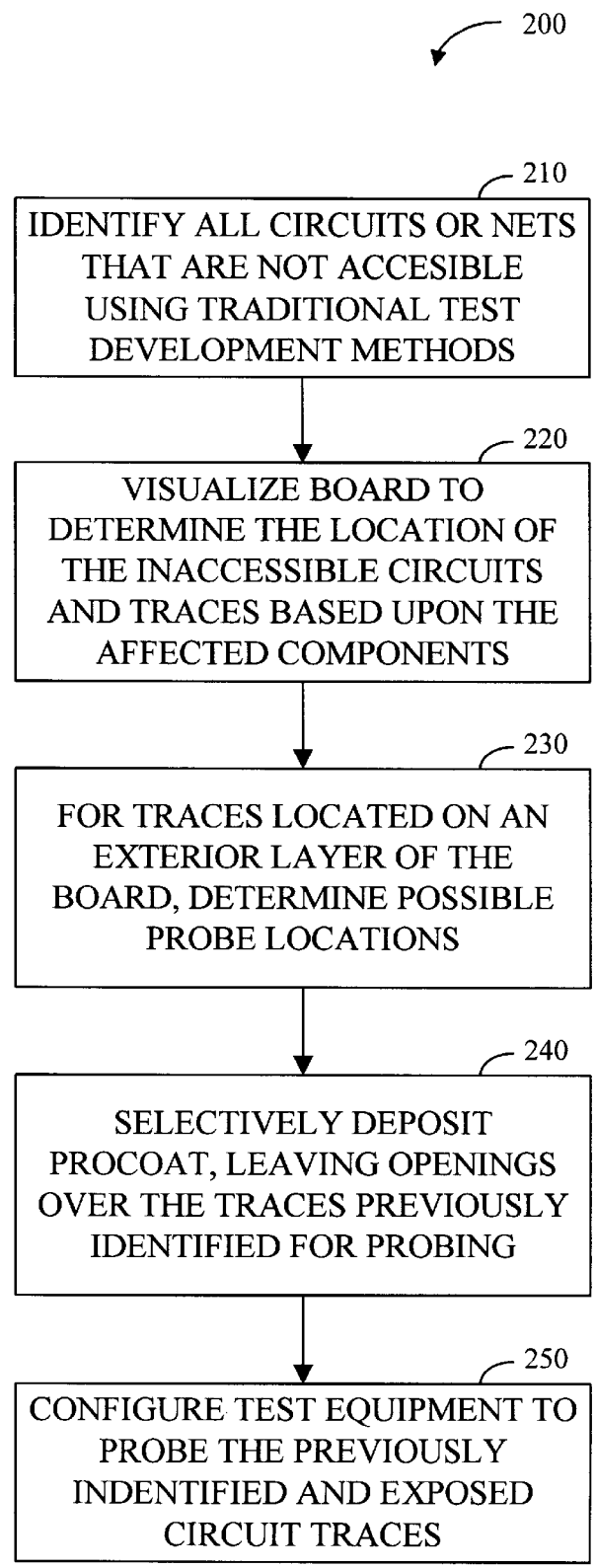
FIG. 2 is a flow diagram of a method according to a preferred embodiment of the present invention.

Referring now to FIG. 2, a method 200 for creating new test points is explained. First, the test engineer identifies or determines which circuits or nets on a PCB are untestable using the traditional testing procedures and test points which were established during the design phase for the PCB (step 210). The engineer will also note which components on the PCB are affected. This step is typically accomplished using standard, commonly available circuit visualization and testing software, well-known to those skilled in the art. Next, the test engineer visualizes the PCB's structure to determine whether the untestable or affected nets, circuits, or components have traces or interconnections located on an exterior surface or portion of the board (step 220). To accomplish this step, the test engineer will use commercially available computer equipment to view the trace layout on a computer display terminal. The exact techniques used will depend upon the type of data available, usually either the raw card fabrication files (known to those skilled in the art as "gerber") or the original PCB design file.

Once the surface traces for the circuit, net, or component of interest have been identified, the test engineer can determine a location or locations on the exterior surface of the PCB suitable to create a new test point for testing purposes (step 230). This will typically involve selecting a point on the surficial circuit traces and identifying it as a new test point which can be used with the test probe of the present invention. This determination is made based upon the accessibility of the trace, the suitability of using the trace, the proximity of the trace to other traces, chips, resistors, other board components, etc.

After the locations of the new test points have been determined, the surface of the PCB is selectively masked using standard masking procedures to protect the new test points from the subsequent deposition of procoat. This allows the desired portions of the surface of the PCB to be protected and the procoat is selectively deposited, leaving the area of the identified trace accessible for subsequent testing via a test probe (step 240). Once the surface of the PCB has been selectively coated, the test equipment can be configured to test or probe the new test points.

Wherever possible, it is desirable to identify multiple traces and multiple points on a trace that may be suitable for new test points. More possible test points will give the engineer a greater possibility of successfully probing the desired circuit, net, or component. For example, if a desired new test point is located too close to other circuit, devices, or traces, the test probe may inadvertently contact other devices or traces located in the proximity of the new test point instead of only contacting the new test point on the trace to be probed. The result could be an electrical short or an inaccurate test result due to undesired input from another signal. Thus, the test engineer must judiciously select test points that are sufficiently distant from other circuit components and traces to assure that only the desired trace or new test point will be contacted and probed.

Referring now to FIG. 1, a typical circuit board 100 is depicted. By reference to printed circuit board 100, the selection process for new test points can be further explained. As shown in FIG. 1, printed circuit board 100 contains multiple interconnected layers 110, 120, 130. While board 100 is depicted as a PCB containing three layers in FIG. 1, the number of layers in a PCB is not material to the practice of the invention. Layers 110, 120, 130 of the board 100 contain devices 141–148. Devices 141–148 are electrically connected by traces 151–158. The traces 151–158 are typically thin lines of deposited conductive material, usually copper.

In FIG. 1, locations 161 and 162 have both been identified as possible new access or test points to test the functionality of a component, circuit, or net located on board 100. Having identified locations 161 and 162 as additional test points, the subsequent board fabrication process is modified so that the procoat is not deposited over those points when it is deposited over the rest of the board 100. This selective deposition of procoat is accomplished using any suitable standard masking procedure known to those skilled in the art. Thus, printed circuit boards fabricated according to the preferred embodiments of the present invention contain openings in the procoat so that underlying circuit traces 151, 158 may be contacted. An external test fixture or apparatus is then configured so that new test points 161, 162 may be contacted and tested.

The most preferred embodiments of the present invention provides a method for creating additional, new access or test points on a circuit board after the design of the board is completed. The methods of the present invention locate otherwise untestable nets or circuits, determines whether those nets contain surficial or exterior traces, identifies an access point or location on the identified traces for testing via a probe, and provides for selective deposition of procoat on the surface of the PCB, thereby creating an opening in the procoat through which the new test points on the traces may be probed. This process, in effect, creates new test points for post-production testing of circuit, nets, or components on a PCB that would otherwise have been untestable.

The process of the invention is advantageous in that it does not require the previous layout of the devices on a circuit board to be changed. The only change in the standard fabrication process required by the invention is that openings must be left in the procoat in the appropriate locations for testing. This change is relatively minor compared to the expense, difficulty, and some times impossibility, of adding additional traditional test points, especially late in the design process. By using the invention in conjunction with the traditional method of providing test points during the circuit and PCB design stage, 100% test coverage for all components of a PCB may often be obtained.

Probing Test Points

Having established a method to expose circuit traces to be used as test points, those test points must be contacted with a probe for testing. While there are a number of commercially available test probes, these existing probes are generally not well suited for use in the present invention. A conventional test probe employs approximately four to eight ounces of spring force. While the rating of the spring provides some nominal value for comparing relative spring strength, the shape of the probe head determines how much pressure is actually applied to a given test point. For instance, a flat probe head distributes the four to eight ounces of spring force over a greater area than a pointed probe head, resulting in less pressure being applied to a given test than would be applied with a spring in a test probe with a pointed head.

Figure 3:
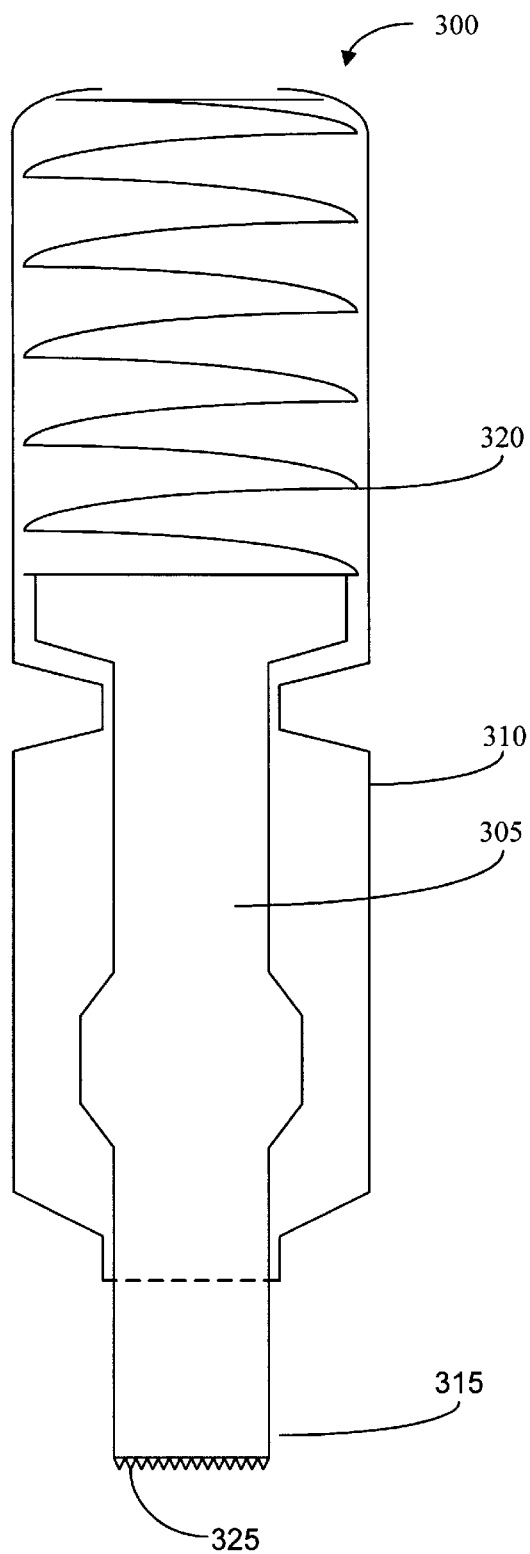
FIG. 3 is a cross-sectional view of a circuit probe according to a preferred embodiment of the invention.

Referring now to FIG. 3, a probe 300 in accordance with the preferred embodiments of the present includes: a plunger 305; an outer barrel 310; a head 315; and a spring 320. Plunger 305 extends through outer barrel 310. One end of plunger 305 extends beyond outer barrel 310 and terminates in head 315. Head 315 is the portion of probe 300 which is used to contact the desired test points. As head 315 contacts a test point, spring 320 biases plunger 305, causing head 315 to apply pressure to the test point. The pressure applied by head 315 to the test point depends both upon the inherent spring force of spring 320 and the physical geometry of head 315. Head 315 should be constructed so as to provide adequate surface area for contacting the trace but should not be so large that it would be cumbersome in typical testing situations. Although test probe 300 is shown in isolation, it should be understood that test probe 300 is typically a component part of a complete testing apparatus or test fixture which can be adjusted and adapted to test and probe many different configurations of printed circuit boards. The use of a testing apparatus or fixture is well known to those skilled in the art.

The best mode for carrying out the most preferred embodiments of the present invention utilizes a test probe 300 with a spring force of less than four ounces (approximately 113.4 grams). The reduced spring force is desirable because the traces to be contacted are extremely thin and easily damaged by the application of excessive force. Even a flat probe head used with the spring force of a typical probe poses a threat to the structural integrity of the traces identified for testing. For this reason, probe 300 will impart a spring force of less than four ounces, which is significantly less than most known test probes used in PCB testing. Several reduced spring force probes have become commercially available and it is anticipated that these test probes may be adapted as described below for use in the preferred embodiments of the present invention.

The best mode of carrying out the invention uses a flat probe head 315. The use of flat probe head 315 further reduces the pressure applied to a trace and makes a relatively large area available to contact the test point. Because of the relatively large area available to contact the test point, the probe may be somewhat misaligned but still adequately contact the test point. The use of a flat probe head 315 also provides other advantages that will become apparent below.

While using a probe with a low spring force reduces the risk of fragmenting the traces, the low spring forces can fail to penetrate the contaminates sometimes present on the surface of a board. The contaminates present on the surface of the board may be fingerprints, airborne dust or dirt particles, or other residue. In order to establish a reliable electrical connection and perform the desired testing procedures, any contaminate present on the circuit trace must be penetrated by the probe.

To assist in penetrating any possible contaminates without damaging the trace(s), dendrites 325 are applied to the probe head 315. Dendrites 325 consist of a series of miniature solder "spikes" or similar protrusions. These spikes penetrate contaminates present on a board, even with the lower spring forces used in the present invention. The use of a flat probe head 315 facilitates the application of dendrites 315.

U.S. Pat. No. 5,137,461 describes the basic formation and deposition of dendrites and this process may be used in conjunction with the preferred embodiments of the present invention. In addition, any other method known to those skilled in the art may also be used to deposit or form dendritic protrusions on the slat surface of probe head 315. In most cases, PCB testing typically involves a "test fixture" or test apparatus containing a probe or series of probes which can be positioned or configured to contact the desired test points of the board to be tested. In accordance with the present invention, the test fixture is designed so that the probe heads of the low spring force probes can contact the exposed circuit traces at the new test points. This allows the present invention to be adapted for use with existing testing equipment currently available in the industry.

While the invention has been particularly shown and described with reference to several exemplary embodiments, those skilled in the art will recognize that other variations on the invention are possible.

What is claimed is:

1. A method comprising the steps of:
    analyzing a printed circuit board design to identify at least one untestable circuit on the printed circuit board;
    identifying at least one access point on a surface of the printed circuit board that provides access to the at least one untestable circuit on the board;
    creating at least one new test point by selectively depositing procoat on the surface of the printed circuit board such that no procoat is deposited over the identified at least one access point; and
    contacting the at least one new test point using a spring-loaded test probe, the test probe having a substantially planar probe head and a spring force less than four ounces.

2. The method of claim 1 further comprising the step of providing a test fixture adapted to contact the at least one new test point.

3. The method of claim 1 wherein the at least one new test point is a point on a circuit trace.

4. The method of claim 1 wherein the location of the at least one test point is selected based on its proximity to other circuit components.

5. The method of claim 1 wherein the step of analyzing the printed circuit board design to identify at least one untestable circuit on the board comprises the step of using a gerber tool to analyze the printed circuit board.

6. The method of claim 1 wherein the step of contacting the at least one new test point comprises the step of contacting the at least one new test point with a substantially planar probe head coated with a plurality of dendritic particles.

7. A method for testing circuits, the method comprising the steps of:
    analyzing a printed circuit board design to identify at least one circuit on the board as an untestable circuit;
    identifying at least one location on the surface of the printed circuit board suitable for providing an access point to the at least one untestable circuit;
    providing a printed circuit board constructed according to the printed circuit board design, the printed circuit board having a surface;
    creating at least one new test point on the surface of the printed circuit board by selectively masking the surface of the printed circuit board to prevent the at least one location from being covered by procoat; and
    contacting the at least one new test point using a spring-loaded test probe, the test probe having a substantially planar probe head and a spring force less than four ounces.

8. The method of claim 7 wherein the step of analyzing the printed circuit board to identify at least one circuit on the board as an untestable circuit comprises the step of using visualization software to analyze the printed circuit board.

9. The method of claim 7 further comprising the step of using a test fixture to contact the at least one new test point.

10. The method of claim 7 wherein the step of identifying at least one location on the surface of the printed circuit board further comprises the step of using the location of at least one circuit component to identify the at least one location on the surface of the printed circuit board.

11. The method of claim 7 wherein the at least one additional test point on the surface of the printed circuit board is a point on a circuit trace located on the surface of the circuit board.

12. The method of claim 7 wherein the step of contacting the at least one new test point comprises the step of contacting the at least one new test point with a substantially planar probe head coated with a plurality of dendritic particles.

13. A method for identifying and probing circuit traces comprising:
    providing a printed circuit board design, the printed circuit board comprising a plurality of nets and a plurality of existing test points suitable for testing at least one of the plurality of nets;
    using a visualization program to locate at least one of the plurality of nets that cannot be tested using the plurality of existing test points;
    identifying at least one new test point, suitable for testing the at least one of the plurality of nets that cannot be tested using the plurality of existing test points;
    providing a printed circuit board constructed according to the printed circuit board design;
    selectively masking the printed circuit board with a protective covering to cover the at least one new test point;
    coating the printed circuit board with a coating;
    removing the protective covering; and
    adjusting a probe in a test fixture to contact the at least one new test point.

* * * * *